(12) United States Patent
Price et al.

(10) Patent No.: US 10,761,128 B2
(45) Date of Patent: Sep. 1, 2020

(54) METHODS AND SYSTEMS FOR INLINE PARTS AVERAGE TESTING AND LATENT RELIABILITY DEFECT DETECTION

(71) Applicant: KLA-Tencor Corporation, Milpitas, CA (US)

(72) Inventors: David W. Price, Austin, TX (US); Robert J. Rathert, Mechanicsville, VA (US); Robert Cappel, Milpitas, CA (US); Kara L. Sherman, Milpitas, CA (US); Douglas G. Sutherland, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 251 days.

(21) Appl. No.: 15/480,244

(22) Filed: Apr. 5, 2017

(65) Prior Publication Data

US 2018/0275189 A1 Sep. 27, 2018

Related U.S. Application Data

(60) Provisional application No. 62/475,749, filed on Mar. 23, 2017.

(51) Int. Cl.
*G01R 31/26* (2020.01)
*G07C 3/14* (2006.01)
(Continued)

(52) U.S. Cl.
CPC ..... *G01R 31/2601* (2013.01); *G01R 31/2831* (2013.01); *G06F 17/18* (2013.01); *G07C 3/14* (2013.01); *G01R 31/2894* (2013.01)

(58) Field of Classification Search
CPC ............ G01R 31/2601; G01R 31/2831; G01R 31/2894; G06F 17/18; G07C 3/14
See application file for complete search history.

(56) References Cited

U.S. PATENT DOCUMENTS

| 7,062,410 B2 * | 6/2006 | Winstead | ........... G01R 31/2837 702/183 |
| 2004/0138846 A1 * | 7/2004 | Buxton | .............. G05B 23/0229 702/108 |

(Continued)

OTHER PUBLICATIONS

International Search Report and Written Opinion dated Jul. 2, 2018 for PCT/US2018/022770.

*Primary Examiner* — Elias Desta
(74) *Attorney, Agent, or Firm* — Suiter Swantz pc llo

(57) ABSTRACT

Methods and systems for inline parts average testing and latent reliability defect recognition or detection are disclosed. An inline parts average testing method may include: performing inline inspection and metrology on a plurality of wafers at a plurality of critical steps during wafer fabrication; aggregating inspection results obtained from inline inspection and metrology utilizing one or more processors to obtain a plurality of aggregated inspection results for the plurality of wafers; identifying one or more statistical outliers among the plurality of wafers at least partially based on the plurality of aggregated inspection results obtained for the plurality of wafers; and disqualifying the one or more statistical outliers from entering a supply chain for a downstream manufacturing process, or segregating the one or more statistical outliers for further evaluation, testing or repurposing.

20 Claims, 5 Drawing Sheets

(51) Int. Cl.
*G01R 31/28* (2006.01)
*G06F 17/18* (2006.01)

(56) References Cited

U.S. PATENT DOCUMENTS

| | | |
|---|---|---|
| 2008/0187842 A1 | 8/2008 | Hung et al. |
| 2008/0262793 A1* | 10/2008 | Subramaniam .... G01R 31/2894 |
| | | 702/179 |
| 2009/0043527 A1 | 2/2009 | Park et al. |
| 2010/0215247 A1 | 8/2010 | Kitamura et al. |
| 2013/0176558 A1 | 7/2013 | Lin et al. |
| 2016/0314578 A1 | 10/2016 | Banerjee et al. |

* cited by examiner

METHODS AND SYSTEMS FOR INLINE PARTS AVERAGE TESTING AND LATENT RELIABILITY DEFECT DETECTION

CROSS-REFERENCE TO RELATED APPLICATIONS

The present application claims the benefit under 35 U.S.C. § 119(e) of U.S. Provisional Application Ser. No. 62/475,749, filed Mar. 23, 2017. Said U.S. Provisional Application Ser. No. 62/475,749 is hereby incorporated by reference in its entirety.

TECHNICAL FIELD

The disclosure generally relates to the field of process control, and particularly to inspection and metrology of semiconductor devices.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

In the course of manufacturing a semiconductor device, a wafer goes through hundreds of processing steps to pattern a functioning device. Over the course of these steps, inspection and metrology steps are performed to ensure the process is in control and will produce functioning product at the end of the manufacturing cycle. Inspection tools may find unintended defects in the patterning whereas metrology tools may measure the physical parameters of the films and patterns versus the intent. While some defects and metrology errors may be so significant as to clearly indicate a device failure, lesser variations may have an unclear effect. A portion of these may later go on to cause early reliability failures of the device after exposure to their working environment. Risk averse users of semiconductor devices, such as automotive, military, aeronautical and medical applications, need failure rates in the Parts per Billion (PPB) range, well below where they are today. Recognizing and controlling these so-called latent reliability defects is key to meeting these industry requirements. Therein lies a need for providing the methods and systems for latent reliability defect detection.

SUMMARY

The present disclosure is directed to an inline part average testing method. The method may include: performing inline inspection and metrology on a plurality of wafers at a plurality of critical steps during wafer fabrication; aggregating inspection results obtained from inline inspection and metrology utilizing one or more processors to obtain a plurality of aggregated inspection results for the plurality of wafers; identifying one or more statistical outliers among the plurality of wafers at least partially based on the plurality of aggregated inspection results obtained for the plurality of wafers; and disqualifying the one or more statistical outliers from entering a supply chain for a downstream manufacturing process, or segregating the one or more statistical outliers for further evaluation, testing or repurposing.

A further embodiment of the present disclosure is an inspection system. The system may include one or more inspection tools configured to perform inline inspection and metrology on a plurality of wafers at a plurality of critical steps during wafer fabrication. The system may also include one or more processors in communication with the one or more inspection tools. The one or more processors may be configured to facilitate inline part average testing of the plurality of wafers. The one or more processors may be further configured to: aggregate inspection results obtained from the one or more inspection tools to obtain a plurality of aggregated inspection results for the plurality of wafers; identify one or more statistical outliers among the plurality of wafers at least partially based on the plurality of aggregated inspection results obtained for the plurality of wafers; and disqualify the one or more statistical outliers from entering a supply chain for a downstream manufacturing process, or segregate the one or more statistical outliers for further evaluation, testing or repurposing.

An additional embodiment of the present disclosure is directed to an inspection system. The system may include one or more inspection tools configured to perform inline inspection and metrology on a plurality of wafers at a plurality of critical steps during wafer fabrication. The system may also include one or more processors in communication with the one or more inspection tools. The one or more processors may be configured to facilitate inline part average testing of the plurality of wafers. The one or more processors may be further configured to: establish a control limit to satisfy a risk tolerance level defined for a downstream manufacturing process that utilizes the plurality of wafers; aggregate inspection results obtained from the one or more inspection tools to obtain a plurality of aggregated inspection results for the plurality of wafers; identify one or more statistical outliers that failed to satisfy the control limit established for the downstream manufacturing process at least partially based on the plurality of aggregated inspection results obtained for the plurality of wafers; and disqualify the one or more statistical outliers from entering a supply chain for a downstream manufacturing process, or segregate the one or more statistical outliers for further evaluation, testing or repurposing.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
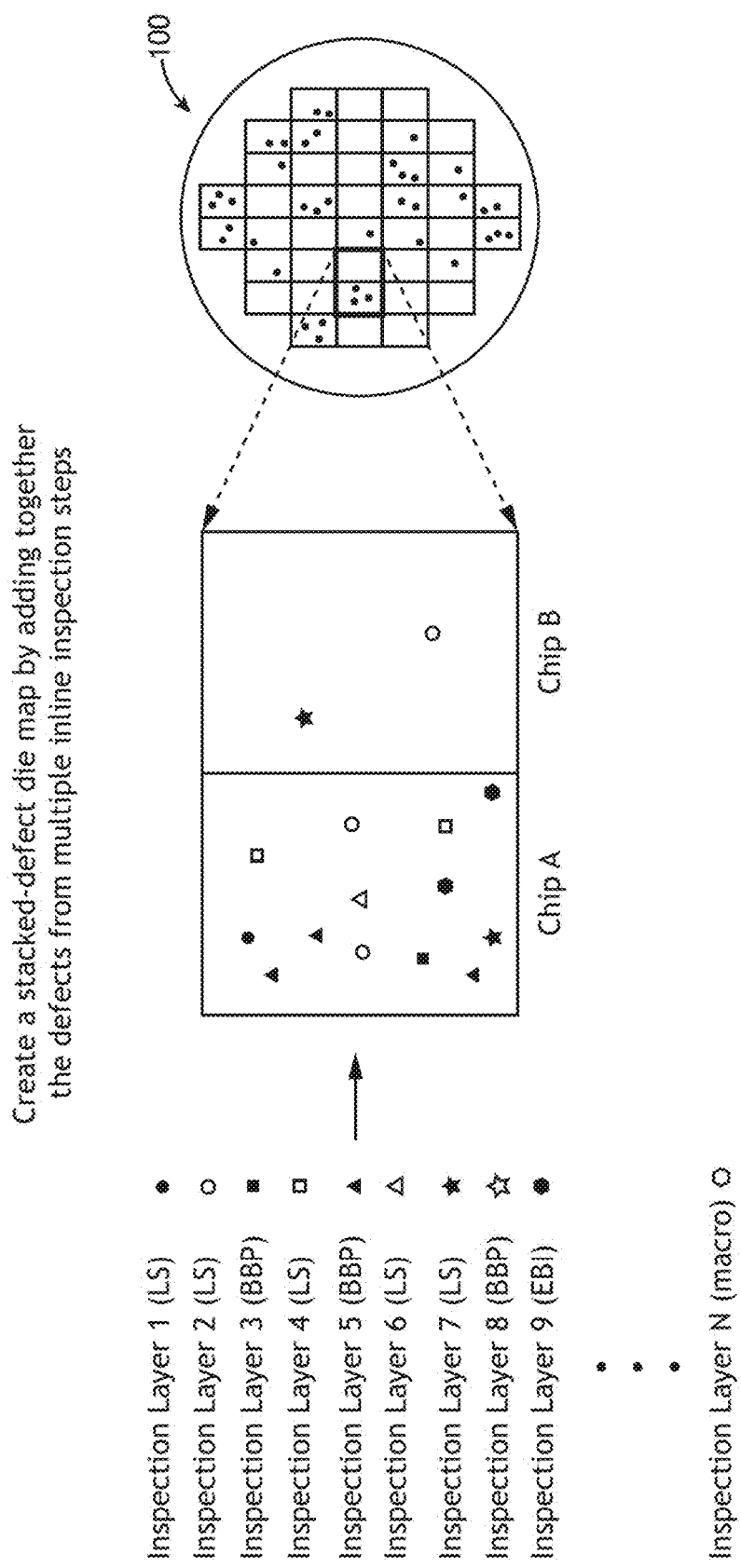
FIG. 1 is an illustration depicting a stacked-defect map representing inspection results obtained from an inline defect inspection tool configured in accordance with an embodiment of the present disclosure.

Reference will now be made in detail to the subject matter disclosed, which is illustrated in the accompanying drawings.

Embodiments of the present disclosure are directed to methods and systems for inline part average testing and latent reliability defect recognition and/or detection. Latent reliability defects refer to defects present in a device from manufacturing that pass initial quality tests but cause premature failures when activated in their working environment. For instance, wafers may be fabricated and utilized to produce various types of semiconductor electronic components. These semiconductor electronic components may then be used in the field for various purposes (e.g., they may be incorporated into automobiles or other types of vehicles, aircraft, military, medical or other devices requiring high reliability or low field failure rates) and may operate in various types of environment. Some of these semiconductor electronic components may fail prematurely at some point in the future, causing reliability issues. Methods and systems configured in accordance with the present disclosure are directed to provide latent reliability defect recognition/detection that can identify at-risk wafer/die for further testing or exclusion from the supply chain to reduce the number of dies that may fail prematurely in the field.

Methods and systems configured in accordance with the present disclosure may utilize inline part average (I-PAT) testing to provide latent reliability defect recognition. Part average testing (PAT) is a statistically based method for removing parts with abnormal characteristics (outliers) from the semiconductors supplied per guidelines established (e.g., automotive industry may have guidelines established by the Automotive Electronics Council). The test limits used in PAT may be established based on a sample of the electrical test results for that particular part with its unique design and processing. Each part design and its associated processing may show a distribution of test results for each test requirement and this data may be used as the basis for establishing PAT limits.

Reliability studies have shown that semiconductor parts that have abnormal electrical characteristics tend to be higher contributors to long-term quality and reliability problems. Specifically, devices that originally passed all manufacturing tests but could be considered outliers compared to other parts in the same population or lot are more likely to fail in the field. PAT methodologies may therefore proactively identify these outliers for further testing, evaluation or exclusion from production shipments. It is noted, however, that existing PAT based upon electrical parametric data from probers and testers generally allow fabrication to achieve part-per-million (PPM) levels of reliability defect control, but struggle to detect latent reliability defects. The new requirement for automotive is part-per-billion (PPB), which represents control levels that existing PAT methodologies fail to satisfy.

Inline part average testing (I-PAT) extends PAT methodology by taking into consideration inspection results provided by inline defect inspection tools (e.g., broadband plasma, laser scanning, macro, backside and the like). Studies have shown that, for a well-designed product and a mature semiconductor manufacturing process, the majority of the defects that will cause latent reliability failures can be detected inline using inline defect inspection tools. The complication is that there are thousands of these defects on every wafer while only a very small fraction of them go on to form potential reliability problems. Thus, using inspection results provided by inline defect inspection tools alone may lead to identification of too many defects (e.g., may find some defects in nearly every die), which may in turn lead to very low production yield (e.g., scrapping nearly every die on the wafer simply because there may be some defects in nearly every die).

It is therefore contemplated that I-PAT configured in accordance with some embodiments of the present disclosure may take into consideration data/results provided by a combination of inline defect inspection tools, metrology tools (e.g., overlay, film thickness, critical dimension and the like), defect analysis or yield management tools, final test data, electrical burn-in data, and/or various other types of statistical data to find correlations that can be used to understand which inline defects may have a statistically higher probability of forming latent reliability defects. Akin to the currently existing parametric methodology, it can be demonstrated that dies with higher levels of defectivity or metrology variability, outside of the normal population distribution, may have a higher incidence of premature failure, even if they pass a final electrical test. The supplier can use this information to selectively subject these dies to further evaluation, testing, repurposing, or selectively exclude these dies from entering a supply chain for a downstream manufacturing process (e.g., for automotive or similar risk-averse applications) supply chain.

Figure 2:
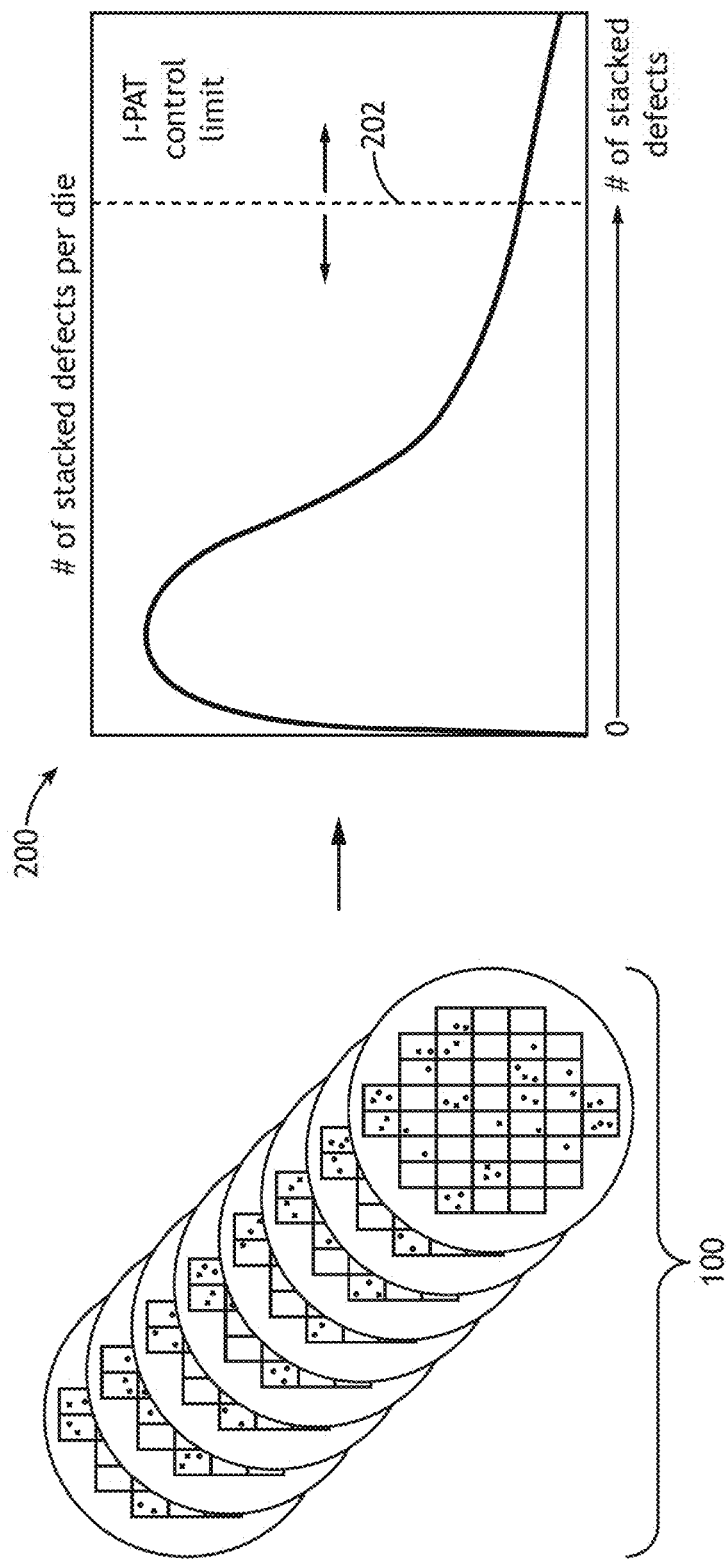
FIG. 2 is an illustration depicting a defect histogram created from dies on a plurality of wafers that have gone through the same inline inspection plan configured in accordance with an embodiment of the present disclosure.

Referring generally to FIGS. 1 and 2. FIG. 1 is an illustration depicting a stacked-defect map 100 representing inspection results obtained from an inline defect inspection tool. The stacked-defect map 100 may represent an aggregated inspection obtained over a plurality of layers. FIG. 2 is a defect histogram 200 that can be created from all the dies on a plurality (a population) of wafers that have gone through the same inline inspection plan. It is contemplated that statistical outliers may then be identified, and these outliers may be segregated from production shipments for further testing, repurposing or exclusion because they may be more likely to fail in the field.

As shown in FIG. 2, the y-axis of the exemplary histogram 200 shown in FIG. 2 may represent the number of stacked defects or some modification thereof based on probability, defect size, defect criticality index, and/or other types of defect measurement. The dashed vertical line 202 may represent a control limit established to satisfy a certain risk tolerance level defined for a specific product. For instance, a semiconductor electronic component to be utilized in a disposable, non-safety-critical device may have a relatively higher risk tolerance level, allowing the control limit 202 to be placed more towards the right of the histogram 200 to tolerate a higher reliability risk (and therefore scrap fewer potentially good die). On the other hand, a semiconductor electronic component to be utilized in a non-disposable, safety-critical device (e.g., an automobile) may have a relatively lower risk tolerance level, forcing the control limit 202 to be placed more towards the left of the histogram 200 to provide a more aggressive binning of potential reliability defects (at the cost of scrapping more potentially good die).

It is contemplated that the control limit 202 may be static, but may also be configured to be dynamically adjustable in some embodiments. For instance, the control limit 202 may be configured as a dynamic limit for the allowable quantity of high-risk anomalies per die, wherein the control limit 202 may be set with varying population of wafer, wafer lot, or a plurality of wafer lots. It is also contemplated that using the number of stacked defects or some modification thereof to set the control limit 202 is merely exemplary and is not meant to be limiting. It is contemplated that the criteria used to determine the control limit 202 and identify at-risk die may include, but is not limited to, stacked layer defect count per die from inspection of one or more inspection sources, single critical layer defect count per die from inspection, defect size populations per die, defect type populations per die (e.g., either from review or inferred from image attributes), defect binning attributes (e.g., magnitude, polarity or other, derived during inspection), and/or known or suspected hot spots.

Additional criteria used to determine the control limit 202 may include defects quantity, size, type or kill ratio within a certain area (defect density) or within a definable, sensitive "care area" known or assumed to be critical to performance, reliability or longevity. Metrology data from targets or die pertaining to overlay measurements, critical dimensions and/or optical critical dimensions shape measurements, film thicknesses or composition, wafer flatness or topography, resistivity, or localized stress information may also be considered when establishing the control limit 202.

It is contemplated that dies that violate one or more control limits 202 mentioned above may be considered de facto "at-risk" (simply by virtue of lying outside of normal distribution for that population) and may be identified and/or excluded from production shipments because they may be more likely to fail in the field. It is noted, however, that this approach may have some limitations. For instance, it may require a large (but manageable) amount of inspection to be performed for it to be effective. Generally, the more inspection performed, the greater the likelihood that the fabrication would be able to identify latent reliability defects. However, in certain situations, it may be possible that much of this data (e.g., certain steps, defect types, defect sizes or the like) may provide little value in this regard. Additionally, a statistical approach may inevitably result in some degree of alpha risk (the risk of falsely rejecting good die, also known as "overkill") and beta risk (the risk of failing to reject actual bad die, also known as "underkill").

Both underkill and overkill are expensive and should be minimized if possible. In some embodiments, it may be possible to optimize the inspection load and increase the confidence in parameters for die exclusion or quarantine by applying data processing algorithms to correlate the inline inspection data with the results from burn-in reliability testing quality control data, field returns or some combination thereof. The purpose of such data processing algorithms is to identify which inspection steps, defect types, defect sizes, and/or metrology parameters are most likely to provide actionable data from which statistical outliers could be most effectively screened. It is contemplated that this approach may help eliminate low correlation inspection steps and may help improve the overall correlation, which may in turn reduce overkill and underkill.

Figure 3:
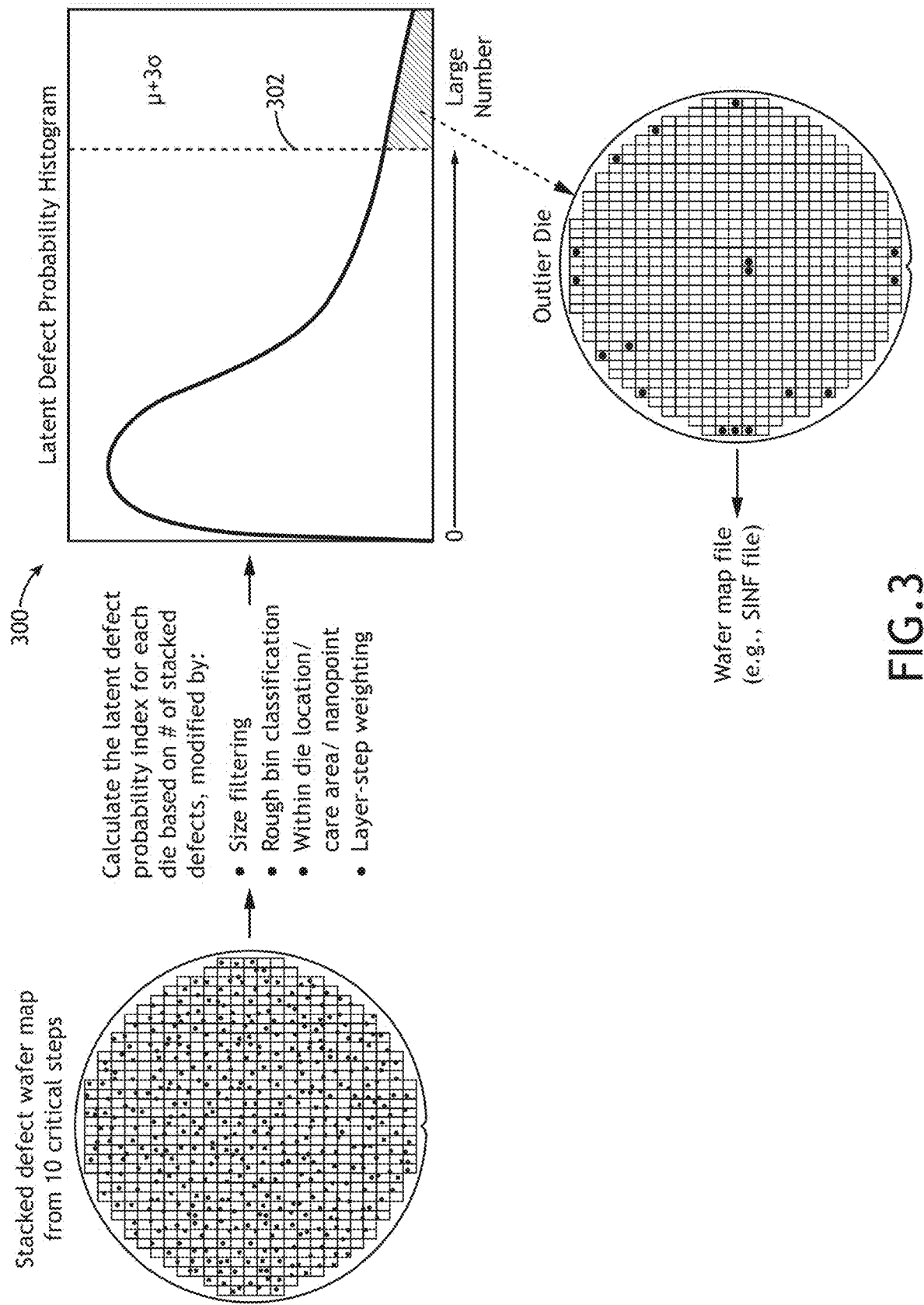
FIG. 3 is another illustration depicting the defect histogram and an exemplary output of an inline defect inspection analysis configured in accordance with an embodiment of the present disclosure.

FIG. 3 is an illustration depicting an exemplary implementation of I-PAT configured in accordance with the process described above. As shown in FIG. 3, a stacked-defect map of a wafer collected from multiple (e.g., 10) critical process steps may be analyzed against a latent defect probability histogram 300. As previously described, a latent defect probability may be calculated for each die on the wafer based on the number of stacked defects, modified by size, rough bin classification, die location, care area, layer-step weighting, and/or other types of defect measurement. It is noted that some of these dies may be identified as statistical outliers (e.g., determined based on comparison against an established control limit 302, such as means plus three standard deviations or the like). These statistical outliers may then be identified in an output file (e.g., a wafer map file that contains data indicating the locations of these dies) or physically marked as defective or otherwise to be segregated for further evaluation, repurposing or rejection from entering the supply chain to help reduce the number of wafers/dies that may fail prematurely in the field.

Figure 4:
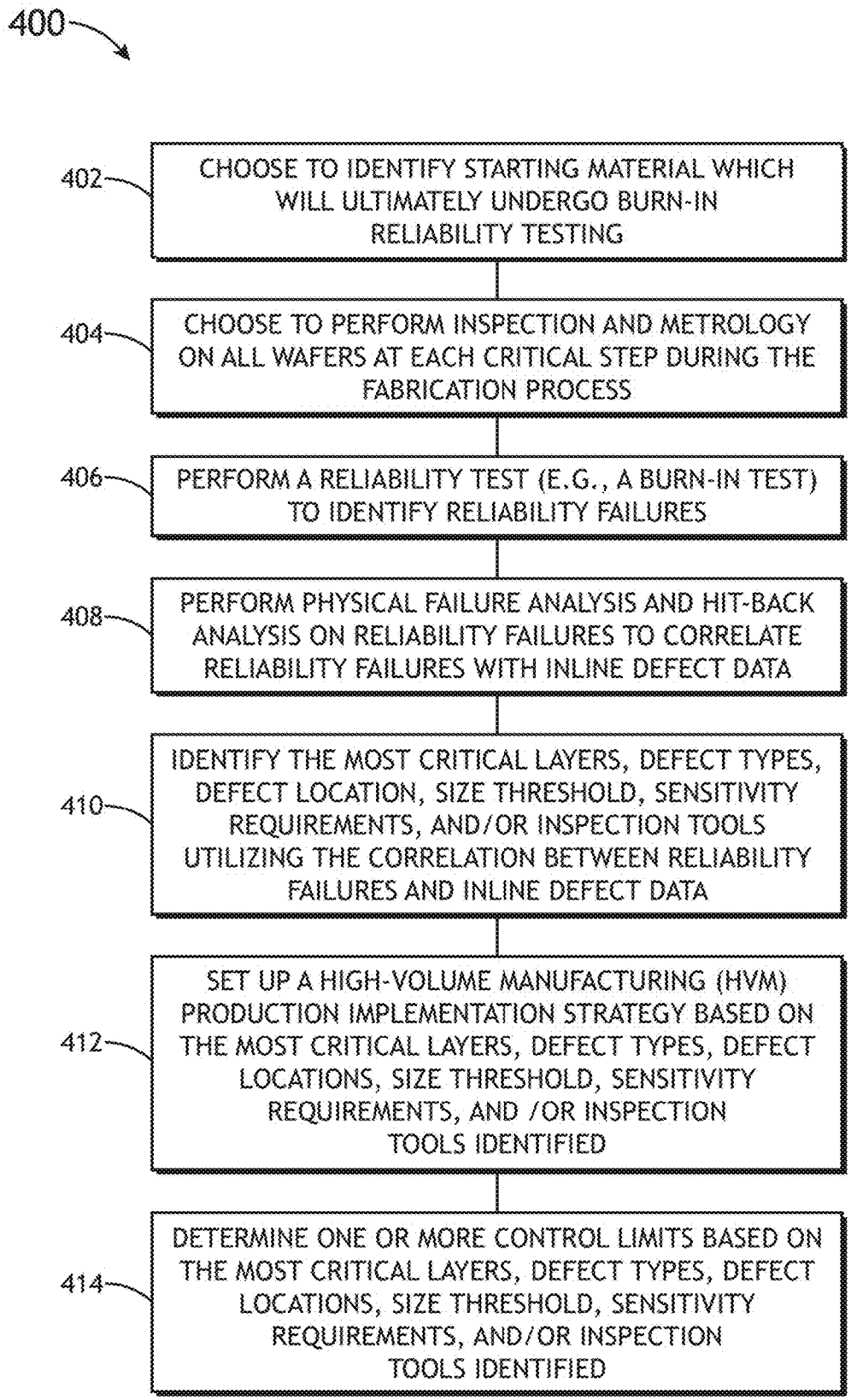
FIG. 4 is a flow diagram depicting an embodiment of an inline part average testing (I-PAT) method configured in accordance with the present disclosure.

FIG. 4 is a flow diagram depicting an embodiment of an inline part average testing (I-PAT) method 400 configured in accordance with the present disclosure. As shown in FIG. 4, a wafer fabricator may choose to identify starting material which will ultimately undergo burn-in reliability testing (step 402). The wafer fabricator may also choose to perform inspection and metrology on all wafers at each critical step (e.g., 100% inspection and metrology) during the fabrication process (step 404). It is contemplated that inspection recipes may be utilized to help find all potential defects. In some embodiments, raw defect data may be included and recorded for subsequent analysis using one or more database or data storage devices.

After processing and final testing, all dies may go through a reliability testing (sometimes referred to as a burn-in, i.e., a process by which components of a system are exercised prior to being placed in service) to identify reliability failures (step 406). Additionally and/or alternatively, physical failure analysis and hit-back analysis may be performed on all reliability failures (e.g., actually occurred in field returns) to correlate reliability failures with inline defect data (step 408). The resulting correlations may then be utilized in step 410 to identify the most critical layers, defect types, defect locations, size threshold, sensitivity requirements, and/or inspection tools. The information obtained in step 410 may be used to set up a high-volume manufacturing (HVM) production implementation strategy (step 412). It is contemplated that such a strategy may still require non-discretionary inspection (e.g., 100% inspection and metrology as set forth in step 404), but may be performed on a reduced set of layers.

The information obtained in step 410 may also be utilized in step 414 to help map out alpha/beta curves so that the wafer fabricator may determine whether (and/or how) to adjust the control limit(s) previously described. It is contemplated that the wafer fabricator may repeat steps 402 through 414 on a continuous basis, refining the inspection strategy to provide the highest correlations at the lowest cost. It is also contemplated that as the cumulative data set grows, data processing algorithms may be used to improve overall correlation and further improve inspection precision.

As will be appreciated from the above, the inline part average testing (I-PAT) method 400 described above provides an integration of inline inspection and part average testing. The I-PAT method 400 configured in this manner provides a higher level of control for latent reliability defects compared to existing inspection techniques. It is contemplated that the I-PAT method 400 may take full advantage of many inline inspection and metrology attributes to identify latent defects that may have escaped the fabrication facility/site. Additionally, the I-PAT method 400 is flexible in that it allows the semiconductor fabricators (and component manufacturers) to adjust the level of control to achieve the desired balance between implementation costs and the reduction in latent reliability defects.

Figure 5:
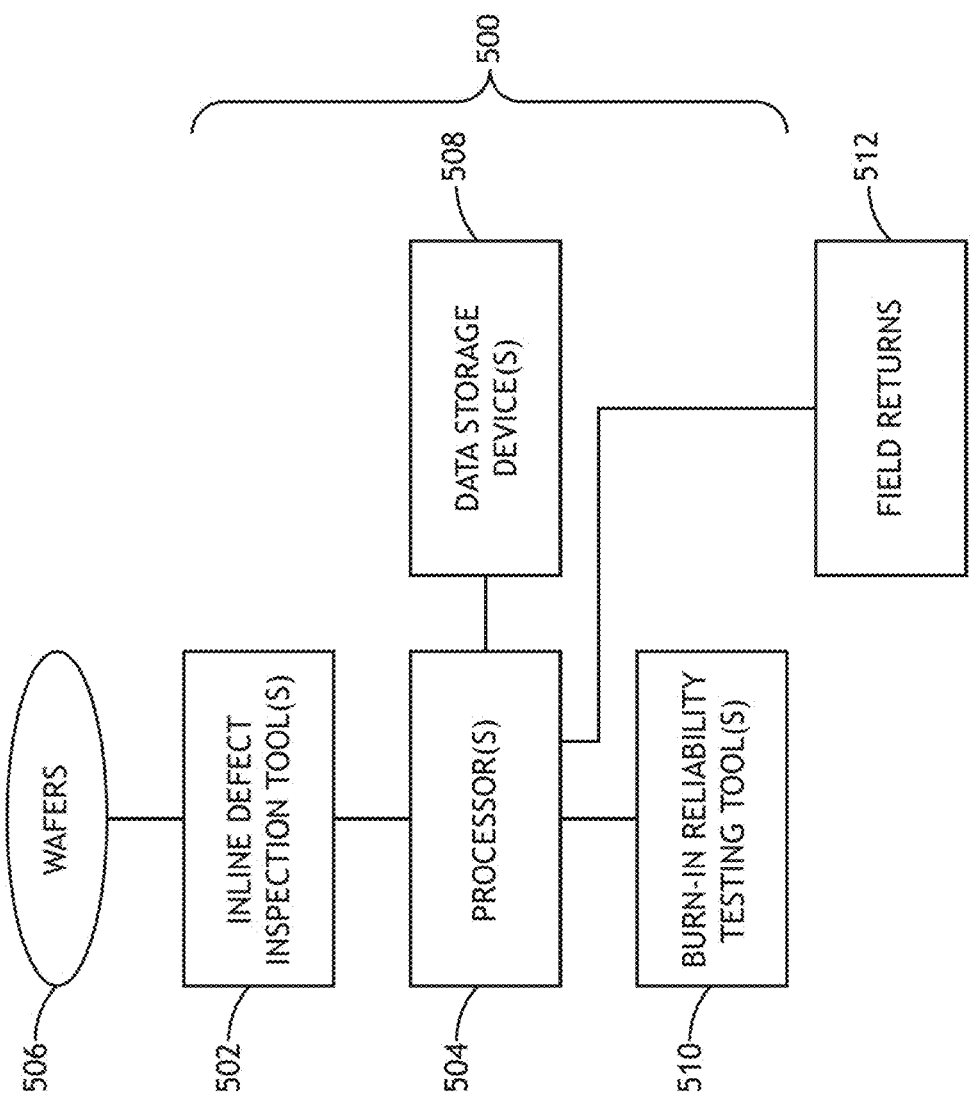
FIG. 5 is a block diagram depicting an inspection system configured in accordance with embodiments of the present disclosure.

Referring now to FIG. 5, a block diagram depicting an inspection system 500 configured in accordance with embodiments of the present disclosure is shown. The inspection system 500 may include one or more inline defect inspection tools 502 communicatively coupled to one or more computer processors 504. The inline defect inspection tool(s) 502 may be configured to inspect a plurality of layers of a plurality of wafers 506 utilizing various inline inspection techniques. Inline defect inspection may be performed by applying some defect detection algorithm and/or method to the images of the wafers obtained. The defect detection algorithm and/or method may include any suitable algorithm and/or method known in the art. For example, the processors 504 may quantify some detected features and compare them to a threshold. Any output having values above the threshold may be identified as a potential defect while any output having values below the threshold may not be identified as a potential defect. In another example, the processors 504 may be configured to send the results obtained to a storage medium 508 with or without performing defect detection on the output.

The processors 504 may also be configured to receive the inspection results obtained by the inline defect inspection tools 502 and aggregate the inspection results to obtain a plurality of aggregated results for the plurality of wafers. The processors 504 may then be utilized to help determine one or more control limits, which may be utilized to help identify dies considered to be de facto "at-risk" and identify them for further assessment or exclude such dies from production shipments because they may be more likely to fail in the field. The processors 504 may be further configured to receive quality control data from burn-in reliability testing tools 510 and/or field returns 512. The processors 504 may process the data received from the burn-in reliability testing tools 510 and/or field returns 512 along with the data received from the inline defect inspection tools 502 to correlate the inline inspection data with the data received from the burn-in reliability testing tools 510 and/or field returns 512. As previously mentioned, the purpose of performing this data correlation is to help identify which inspection steps, defect types, defect sizes, and/or metrology parameters are most likely to provide actionable data from which statistical outliers could be most effectively screened. It is contemplated that this correlation process may help disqualify/eliminate low correlation inspection steps and may help improve the overall correlation, which may in turn reduce overkill and underkill. In some embodiments, wafers/dies that have been identified to have latent reliability issues may be reported on one or more display devices. Alternatively, wafers/dies that have been identified to have latent reliability issues may be identified or physically marked as defective or otherwise segregated for further evaluation, repurposing or rejected from entering the supply chain to help reduce the number of wafers/dies that may fail prematurely in the field.

It is to be understood that each of the processor(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a stand-alone or a networked tool.

If a computer system includes more than one computer subsystems, then the different computer subsystems may be coupled to each other such that images, data, information, instructions, etc. can be sent between the computer subsystems as described further herein. For example, one computer subsystem may be coupled to additional computer subsystem(s) by any suitable transmission media, which may include any suitable wired and/or wireless transmission media known in the art. Two or more of such computer subsystems may also be effectively coupled by a shared computer-readable storage medium.

It is contemplated that an additional embodiment of the present disclosure relates to a non-transitory computer-readable medium storing program instructions executable on a computer system for performing a computer-implemented method for target placement as described above. The computer-readable medium may be a storage medium such as a magnetic or optical disk, a magnetic tape, or any other suitable non-transitory computer-readable medium known in the art. The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

It is also to be understood that while the examples above referred to wafers, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is contemplated that the methods and systems described in the present disclosure may be implemented as standalone products or as components of various wafer measurement, inspection, and/or hotspot discovery tools. It is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. It is also understood that the various blocks depicted in the figures are presented separately for illustrative purposes. It is contemplated that while the various blocks depicted in the figures may be implemented as separate (and communicatively coupled) devices and/or processing units, they may also be integrated together without departing from the spirit and the scope of the present disclosure.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An inline part average testing method, comprising:
performing, with an inline inspection tool, inline inspection and metrology on a plurality of wafers at a plurality of critical steps during wafer fabrication;
aggregating, with one or more processors, inspection results obtained from the inline inspection and metrology to obtain a plurality of aggregated inspection results for the plurality of wafers;
identifying, with the one or more processors, one or more statistical outliers among the plurality of wafers at least partially based on the plurality of aggregated inspection results obtained for the plurality of wafers and a correlation of reliability testing of one or more devices formed from one or more of a previously fabricated plurality of wafers and aggregated inspection results obtained for the previously fabricated plurality of wafers; and
selectively disqualifying, based on a selected risk tolerance level, with the one or more processors, a portion of the one or more statistical outliers of the plurality of wafers from entering a supply chain for a downstream manufacturing process when the one or more statistical outliers reside in a functioning device; and
reporting the selectively disqualified portion of the one or more statistical outliers of the plurality of wafers for marking.

2. The method of claim 1, wherein the one or more statistical outliers include one or more dies contained in one or more wafers of the plurality of wafers.

3. The method of claim 1, further comprising:
segregating the one or more statistical outliers disqualified from entering the supply chain for further evaluation, testing or repurposing.

4. The method of claim 1, wherein said selectively disqualifying a portion of the one or more statistical outliers of the plurality of wafers from entering a supply chain for a downstream manufacturing process when the one or more statistical outliers reside in a functioning device based on a selected risk tolerance level further comprises:
establishing a control limit to satisfy the selected risk tolerance level defined for the downstream manufacturing process.

5. The method of claim 4, wherein the control limit is established at least partially based on a number of defects in the aggregated inspection results for the plurality of wafers.

6. The method of claim 4, wherein the control limit is established at least partially based on: aggregated defect count per die determined based on the inline inspection, single critical layer defect count per die determined based on the inline inspection, defect size population per die, defect type population per die, defect quantity, defect size, kill ratio within a definable area, overlay measurement, critical dimension, optical critical dimension, shape measurement, film thicknesses, wafer flatness, wafer resistivity, or localized wafer stress.

7. The method of claim 1, further comprising:
performing reliability testing of the plurality of wafers after the wafer fabrication; and
correlating results of the reliability testing of the plurality of wafers and the plurality of aggregated inspection results obtained for the plurality of wafers.

8. The method of claim 7, further comprising:
performing failure analysis on one or more dies retrieved from one or more failed devices; and
correlating results of the failure analysis and the plurality of aggregated inspection results obtained for the plurality of wafers.

9. A system, comprising:
one or more inspection tools configured to perform inline inspection and metrology on a plurality of wafers at a plurality of critical steps during wafer fabrication; and
one or more processors in communication with the one or more inspection tools, the one or more processors configured to facilitate inline part average testing of the plurality of wafers, the one or more processors further configured to:
aggregate inspection results obtained from the one or more inspection tools to obtain a plurality of aggregated inspection results for the plurality of wafers;
identify one or more statistical outliers among the plurality of wafers at least partially based on the plurality of aggregated inspection results obtained for the plurality of wafers and a correlation of reliability testing of one or more devices formed from one or more of a previously fabricated plurality of wafers and aggregated inspection results obtained for the previously fabricated plurality of wafers; and
selectively disqualify, based on a selected risk tolerance level, a portion of the one or more statistical outliers of the plurality of wafers from entering a supply chain for a downstream manufacturing process when the one or more statistical outliers reside in a functioning device; and
report the selectively disqualified portion of the one or more statistical outliers of the plurality of wafers for marking.

10. The system of claim 9, wherein the one or more statistical outliers include one or more dies contained in one or more wafers of the plurality of wafers.

11. The system of claim 9, wherein the one or more processors is further configured to:
segregate the one or more statistical outliers disqualified from entering the supply chain for further evaluation, testing or repurposing.

12. The system of claim 9, wherein the one or more processors is further configured to:
establish a control limit to satisfy the selected risk tolerance level defined for the downstream manufacturing process.

13. The system of claim 12, wherein the one or more processors is configured to establish the control limit at least partially based on a number of defects in the aggregated inspection results for the plurality of wafers.

14. The system of claim 12, wherein the one or more processors is configured to establish the control limit at least partially based on: aggregated defect count per die determined based on the inline inspection, single critical layer defect count per die determined based on the inline inspection, defect size population per die, defect type population per die, defect quantity, defect size, kill ratio within a definable area, overlay measurement, critical dimension, optical critical dimension, shape measurement, film thicknesses, wafer flatness, wafer resistivity, or localized wafer stress.

15. The system of claim 9, wherein the one or more processors is further configured to:
perform reliability testing of the plurality of wafers after the wafer fabrication; and
correlate results of the reliability testing of the plurality of wafers and the plurality of aggregated inspection results obtained for the plurality of wafers.

16. The system of claim 15, wherein the one or more processors is further configured to:
  perform failure analysis on one or more dies retrieved from one or more failed devices; and
  correlate results of the failure analysis and the plurality of aggregated inspection results obtained for the plurality of wafers.

17. A system, comprising:
  one or more inspection tools configured to perform inline inspection and metrology on a plurality of wafers at a plurality of critical steps during wafer fabrication; and
  one or more processors in communication with the one or more inspection tools, the one or more processors configured to facilitate inline part average testing of the plurality of wafers, the one or more processors further configured to:
    establish a control limit to satisfy a selected risk tolerance level defined for a downstream manufacturing process that utilizes the plurality of wafers;
    aggregate inspection results obtained from the one or more inspection tools to obtain a plurality of aggregated inspection results for the plurality of wafers;
    identify one or more statistical outliers that failed to satisfy the control limit established for the downstream manufacturing process at least partially based on the plurality of aggregated inspection results obtained for the plurality of wafers and a correlation of reliability testing of one or more devices formed from one or more of a previously fabricated plurality of wafers and aggregated inspection results obtained for the previously fabricated plurality of wafers; and
    selectively disqualify a portion of the one or more statistical outliers of the plurality of wafers from entering a supply chain for the downstream manufacturing process when the one or more statistical outliers reside in a functioning device based on the control limit; and
    report the selectively disqualified portion of the one or more statistical outliers of the plurality of wafers for marking.

18. The system of claim 17, wherein the one or more processors is further configured to:
  segregate the one or more statistical outliers disqualified from entering the supply chain for further evaluation, testing or repurposing.

19. The system of claim 17, wherein the one or more processors is further configured to:
  perform reliability testing of the plurality of wafers after the wafer fabrication; and
  correlate results of the reliability testing of the plurality of wafers and the plurality of aggregated inspection results obtained for the plurality of wafers.

20. The system of claim 19, wherein the one or more processors is further configured to:
  perform failure analysis on one or more dies retrieved from one or more failed devices; and
  correlate results of the failure analysis and the plurality of aggregated inspection results obtained for the plurality of wafers.

* * * * *